United States Patent
Chua et al.

(10) Patent No.: US 8,652,878 B2
(45) Date of Patent: Feb. 18, 2014

(54) STRESS-ENGINEERED INTERCONNECT PACKAGES WITH ACTIVATOR-ASSISTED MOLDS

(71) Applicant: Palo Alto Research Center Incorporated, Palo Alto, CA (US)

(72) Inventors: Christopher L. Chua, San Jose, CA (US); Bowen Cheng, Redwood City, CA (US); Eugene M. Chow, Fremont, CA (US); Dirk De Bruyker, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/799,168

(22) Filed: Mar. 13, 2013

(65) Prior Publication Data
US 2013/0196471 A1    Aug. 1, 2013

Related U.S. Application Data

(62) Division of application No. 12/471,188, filed on May 22, 2009, now Pat. No. 8,405,198.

(51) Int. Cl.
*H01L 21/44* (2006.01)

(52) U.S. Cl.
USPC ............................................................. 438/109

(58) Field of Classification Search
USPC ......... 257/686, 777, 788, 789, 795, 779, 782, 257/783–784; 438/106, 108–109, 123, 124, 438/112, 612, 617, 614, 618
See application file for complete search history.

(56) References Cited

U.S. PATENT DOCUMENTS

| | | | |
|---|---|---|---|
| 6,213,789 B1 | 4/2001 | Chua et al. | |
| 7,425,464 B2 | 9/2008 | Fay et al. | |
| 2009/0014858 A1* | 1/2009 | Boon et al. | 257/686 |
| 2009/0140630 A1 | 6/2009 | Kijima et al. | |

* cited by examiner

*Primary Examiner* — Hoa B Trinh
(74) *Attorney, Agent, or Firm* — Marger Johnson & McCollom, PC

(57) ABSTRACT

A method includes providing a pad chip having contact pads, providing a spring chip having micro-springs, applying a chemical activator to one of either the pad chip or the spring chip, applying an adhesive responsive to the chemical activator on the other of the pad chip or the spring chip, aligning the pad chip to the spring chip such that the micro-springs will contact the contact pads, and pressing the pad chip and the spring chip together such that the chemical activator at least partially cures the adhesive.

7 Claims, 5 Drawing Sheets

STRESS-ENGINEERED INTERCONNECT PACKAGES WITH ACTIVATOR-ASSISTED MOLDS

CROSS REFERENCE TO RELATED APPLICATION

This is a Division of co-pending U.S. patent application Ser. No. 12/471,188, filed May 22, 2009, entitled Stress-Engineered Interconnect Packages with Activator-Assisted Molds, the disclosure of which is herein incorporated by reference in its entirety.

BACKGROUND

Micro-spring packages generally involve an integrated circuit arranged on a substrate where the integrated circuit has contact pads, referred to here as the pad chip. Another circuit package having protruding contact springs, referred to here as the spring chip, is aligned with the pad chip such that the springs contact the pads. An adhesive holds the springs in contact with the pads.

The process typically includes dispensing an uncured adhesive onto the pads prior to being brought into contact with the springs. Once the springs contact the pads, the adhesive is cured, converting it into a robust, solid mold. Curing may include exposing the adhesive to UV light. An example of such a process is given in U.S. Pat. No. 6,213,789, "Method and Apparatus for Interconnecting Devices Using an Adhesive," issued Apr. 10, 2001.

However, this approach does not scale well for packages having thousands of spring interconnects contacting large sized pads. The contacts fail when subjected to even mild thermal soaks. One issue that arises from the size of the pads. Generally, UV curing involves exposing the adhesive to UV light from underneath the pad. The larger pads block the light, resulting in partially cured adhesive. When the partially cured adhesive heats up in a thermal soak, it can migrate into the contact area, causing the contacts to fail. This thermally-induced effect means using thermally set adhesives instead of UV-cured adhesives would also result in similar contact failures.

DETAILED DESCRIPTION OF THE EMBODIMENTS

Figure 1:
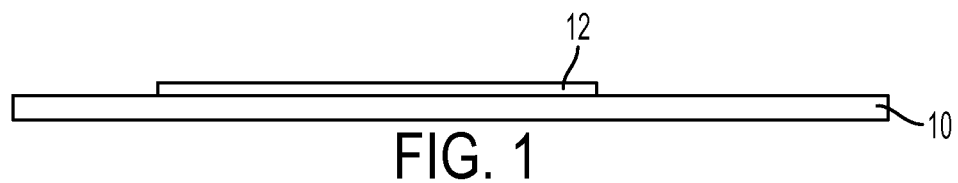
FIGS. 1-4 show a current process for manufacture of a spring interconnect and the resulting interconnect.

FIGS. 1-4 show an embodiment of a current process for manufacture of a spring interconnect package. FIG. 1 shows a 'pad chip' 10 having at least one contact pad 12. The pad chip generally consists of a substrate 10, which may be glass, ceramic, semiconductor, or a flexible organic substrate, as examples. The contact pad may reside on a device, not shown, or directly on the substrate.

Figure 2:
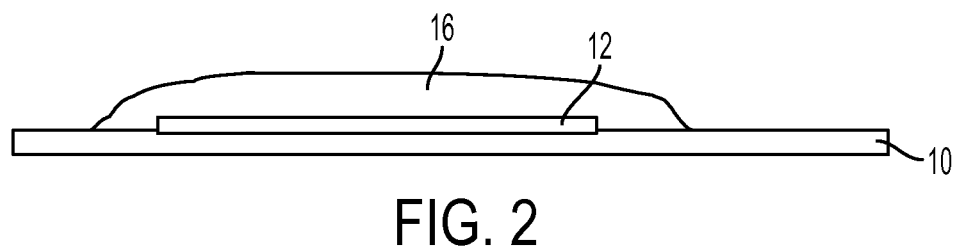

FIG. 2 shows the pad chip being prepared for packaging with a spring chip. This generally involves dispensing an adhesive or other type of mold compound 16 over the pad chip. When the spring chip is mated to the pad chip, this compound is cured and creates a solid and robust mold around the interconnect. The contact between the contact pad and the spring will be referred to as the interconnect, and the area in which multiple interconnects are made between the two chips will be referred to as the interconnect area. At least one of the pad chip and the spring chip may contain electronic devices, the term electronic devices including photo-electronic devices (photonic devices). These may include transistors, photodetectors, light emitting diodes (LEDs), and laser diodes.

In an embodiment, the springs on the spring chip are batch-fabricated using stress-engineered thin films. The films are sputter-deposited with a built-in stress gradient so that, when patterned and released from their substrate, they curl out of the wafer plane with a designed radius of curvature. Stress engineering is accomplished by controlling the ambient pressure during film deposition. Many refractory metals have a common property of acquiring tensile stress when sputtered at high pressures and compressive stress when sputtered at low pressures. One such metal is, for example, a molybdenum-chromium (MoCr) alloy. The exact stress-versus-pressure behavior is a function of the specific sputter tool geometry, the type of substrate used, and other process parameters. In one sputter setup, MoCr films sputtered below pressures of 2.35 mTorr produce compressive films, while those sputtered at higher deposition pressures produce tensile films. The effect allows one to readily and reproducibly dial in a stress values ranging from −2 GPa to +2 GPa just by changing the sputter pressure.

A stress gradient is induced by simply changing the ambient pressure during film deposition. A film that is compressive at the bottom and tensile on the surface is, for example, realized by increasing the pressure during sputtering. In practice, this pressure control is accomplished by flowing Argon and widening or narrowing an orifice opening to the pump. When patterned and released, such a stress-graded film curls up out of the wafer plane to form springs. Once released from the substrate the springs can be coated or plated to adjust its electrical and physical properties.

Figure 3:
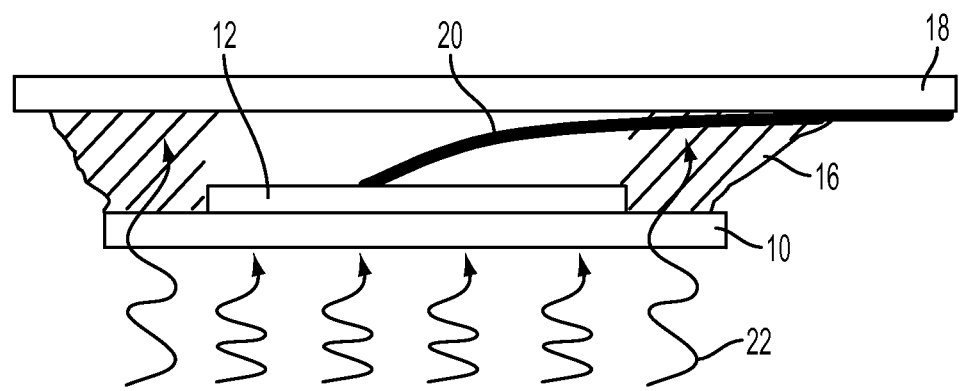

Once the two chips are aligned, they are brought into contact, as shown in FIG. 3. The molding compound or adhesive 16 seals the package from the environment, as well as protecting the interconnect between the spring 20 and the contact pad 12. At this point, the molding compound 16 is still pliable, allowing the spring 20 to penetrate and make connection with the contact pad 12. In this embodiment, the molding compound cures upon exposure to ultraviolet (UV) light, shown by arrows such as 22.

Figure 4:
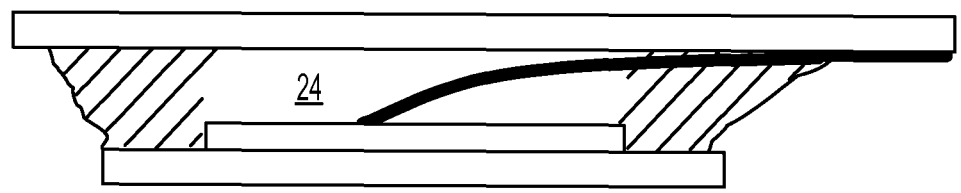

In this embodiment, the substrate 10 upon which the pad 12 resides is glass or other transparent material. However the pad 12 blocks the UV light from curing part of the molding compound 16. This may also be true if the pad 12 resides on a device, where the device would also block the curing light. FIG. 4 shows the region 24 that consists of insufficiently cured adhesive. The adhesive is insufficiently cured in that when exposed to heat during thermal cycling of the device's operation, some of the adhesive may migrate into the area of the interconnection and cause the interconnection to fail. Use of thermally set adhesives or molding compounds would not alleviate this problem, as the application of heat to set the adhesive would generally cause relative movements that result in migration of insulating materials into the interconnection.

Experiments have found that the package disclosed above does not scale to packages containing thousand of spring interconnects contacting large size pads. Electrical contacts for these packages tend to fail subjected to even mild thermal soaks. The below table lists electrical resistances of different daisy chain interconnects after a thermal soak at 90° C. after 65 hours. Many daisy chain interconnects developed contact failures. It should be noted that no further contact failures occurred after the initial set of failures. Good contacts remained good when subjected to further thermal cycling or humidity soaks.

| Daisy Chain ID | Number of Contacts | After package assembly ohms/contact | After 90° C. soak for 65 hours ohms/contact | After 24 100° C./0° C. thermal cycles ohms/contact |
|---|---|---|---|---|
| 1 | 2 | 3.11 | Open | open |
| 2 | 2 | 1.77 | 1.70 | 1.72 |
| 3 | 2 | 1.79 | 1.80 | 1.85 |
| 4 | 2 | 3.31 | 3.27 | 3.28 |
| 5 | 2 | 5.04 | 4.92 | 4.92 |
| 6 | 2 | 4.39 | 4.30 | 4.31 |
| 7 | 2 | 4.51 | 4.43 | 4.44 |
| 8 | 2 | 5.15 | 5.07 | 5.11 |
| 9 | 8 | 1.21 | 1.27 | open |
| 10 | 8 | 1.22 | 1.21 | 1.25 |
| 11 | 28 | 0.21 | 0.26 | 0.30 |
| 12 | 28 | 0.22 | 0.22 | 0.22 |
| 13 | 42 | 0.40 | Open | open |
| 14 | 42 | 0.40 | 0.46 | 0.73 |
| 15 | 134 | 0.32 | Open | open |
| 16 | 134 | 0.33 | 0.32 | 0.33 |
| 17 | 246 | 0.35 | Open | open |
| 18 | 246 | 0.35 | Open | open |
| 19 | 384 | 0.31 | Open | open |
| 20 | 530 | 0.30 | Open | open |
| 21 | 530 | 0.31 | 0.31 | 0.34 |

The first column in table 1 lists the identification number of each daisy chain in the package. The second column lists the number of interconnects contained within each daisy chain. The third column lists the normalized resistance measured for each chain after package assembly but before any reliability stress test. The fourth column indicates the effect of placing the package in a 90° C. oven for 65 hours. Seven daisy chains suffered contact failures after this thermal soak. Chains containing more interconnects were more prone to failures because even a single contact failure would produce an open circuit. Column 5 shows what happened when the package was subjected to subsequent thermal cycling. It appeared that the initial thermal soak stabilized the package, so no further contact failures occurred during the more aggressive thermal cycling.

Experiments indicate that the contact failures in Table 1 are likely caused by insufficiently cured adhesive creeping between the spring/pad interface during the thermal soak. FIG. 3 shows the adhesive curing process in a package that contains large-size contact pads. In this case, the adhesive is cured by illuminating the adhesive with ultra-violet light through a transparent glass wafer. The large contact pad 12 obscures a significant portion of ultraviolet light from reaching the critical spring/pad interface as shown in FIG. 3, so adhesive around that region 24 remains uncured, shown in FIG. 4.

When the package is subjected to thermal stress, uncured adhesive can migrate into the spring/pad interface causing contact failures. Since elevated temperatures also cure the adhesive, packages that have undergone thermal soak will no longer contain uncured adhesive. This thermal curing of adhesive explains the data in the table showing that interconnects that survive the initial thermal soak remain good when subjected to subsequent thermal cycling. The experiment also suggested that using temperature to do a primary adhesive cure is not a good option for forming the mold because the thermal soak process causes contact failures.

Figure 5:
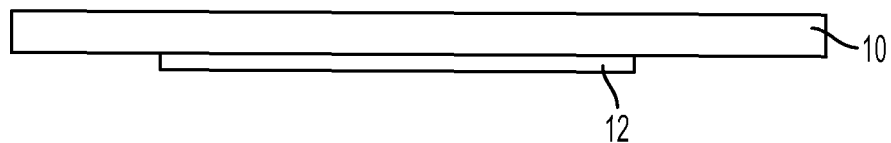
FIGS. 5-8 show an embodiment of process of manufacturing a spring interconnect package.
Figure 6:
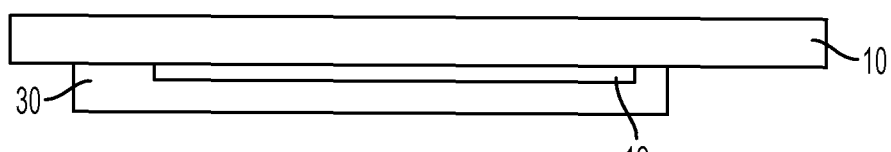

FIGS. 5-8 show an embodiment of a process of manufacturing a spring interconnect package that alleviates some of these issues. In FIG. 5, the pad chip 10 has a contact pad 12. FIG. 6 shows application of a chemical activator 30. In this instance the activator is dispensed onto the pad chip, but it may be dispensed onto the spring chip as well. No limitation is intended nor should any be implied by any application of substances to either the spring chip or the pad chip. These are merely examples. The end result desired is that the activator and the adhesive come into contact with each other in the interconnect area, in which the issue of partially-cured adhesive occurs.

The selection of the chemical activator may depend upon the nature of the adhesive used and its curing requirements. One aspect to consider in the activator is its ability to cure the adhesive at room temperature. As discussed above, the application of heat to the package prior to curing causes interconnect failures. Another aspect to consider is the speed of curing. For example, a slower curing time allows adequate time between the package alignment and contact formation and the adhesive cure. In one embodiment, the activator and adhesive were selected to have a curing time of over 30 minutes.

Figure 7:
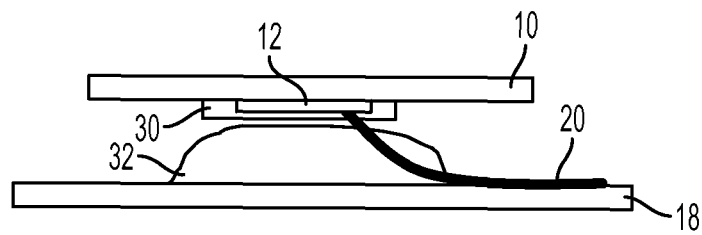

Several examples of both activators and adhesives are available. For example, an activator may be acetone-based and paired with a low-viscosity UV or visible light curable adhesive, such as Loctite® 7075 paired with Loctite®3101. Another example may include a primer as the activator, paired with a UV curable adhesive, such as Loctite® 7649 paired with Loctite® 352. FIG. 7 shows a spring chip 18 having the micro-spring 20 with an adhesive 32 in the region that will correspond to the interconnect region once the two chips are aligned. The two chips are shown prior to contact.

Figure 8:
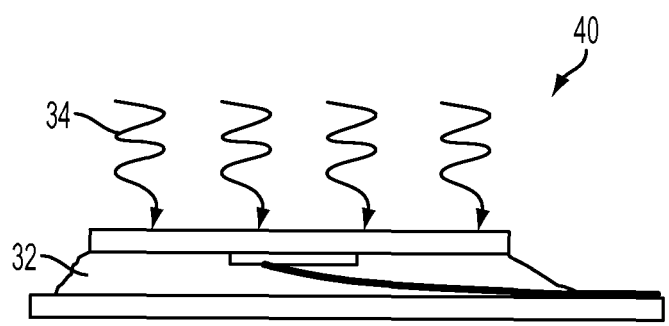

FIG. 8 shows the resulting package 40. In this example, UV light shown by rays such as 34 causes the adhesive 32 to cure completely. It must be noted that the chemical activator 30 may cause the adhesive to cure completely, but it will cause the adhesive to cure at least partially. If the activator does cause the adhesive to cure completely, the application of UV light becomes optional.

The resulting package 40 has adequately cured adhesive such that no adhesive will migrate into the contact areas between the micro-springs and the contact pads. The contacts now reside in an adhesive mold that protects the contacts from the environment and makes a more robust package.

In experiments, the packages were placed in a chamber that cycles the temperature between 100° C. and 0° C. on a 40-minute duty cycle. Humidity testing was performed of placing sample packages in an environment of 85% relative humidity at and elevated temperature of 85° C. In addition to characterizing the electrical resistance of each daisy chain at different time intervals, some samples underwent continuous monitoring for electrical glitches while being thermal cycled. The table below tabulates the pre and post thermal cycling daisy chain resistances of a package after 226 thermal cycles.

| Daisy Chain ID | Number of Contacts | After package assembly ohms/contact | After 226 thermal cycles ohms/contact |
| --- | --- | --- | --- |
| 1 | 2 | 0.10 | 0.11 |
| 2 | 2 | 3.39 | 3.61 |
| 3 | 2 | 0.12 | 0.11 |
| 4 | 2 | 0.09 | 0.10 |
| 5 | 2 | 3.26 | 3.58 |
| 6 | 2 | 0.10 | 0.11 |
| 7 | 2 | 0.09 | 0.08 |
| 8 | 2 | 0.08 | 0.09 |
| 9 | 2 | 0.08 | 0.09 |
| 10 | 2 | 0.08 | 0.08 |
| 11 | 134 | 0.23 | 0.23 |
| 12 | 134 | 0.23 | 0.23 |
| 13 | 246 | 0.22 | 0.23 |
| 14 | 246 | 0.22 | 0.23 |
| 15 | 384 | 0.22 | 0.24 |
| 16 | 384 | 0.21 | 0.23 |
| 17 | 530 | 0.24 | 0.24 |
| 18 | 530 | 0.23 | 0.23 |

The table below tabulates the daisy chain resistances of a different package after 65 hours of humidity testing. The test results show no contact failures.

| Daisy Chain ID | Number of Contacts | After package assembly ohms/contact | After 85° C. 85% RH soak for 88 hours ohms/contact |
| --- | --- | --- | --- |
| 1 | 2 | 0.10 | 0.14 |
| 2 | 2 | 0.09 | 0.14 |
| 3 | 2 | 0.03 | 0.13 |
| 4 | 2 | 0.11 | 0.16 |
| 5 | 2 | 0.05 | 0.14 |
| 6 | 2 | 0.10 | 0.13 |
| 7 | 2 | 0.11 | 0.11 |
| 8 | 2 | 0.05 | 0.11 |
| 9 | 2 | 0.05 | 0.12 |
| 10 | 2 | 0.10 | 0.10 |
| 11 | 134 | 0.68 | 0.78 |
| 12 | 134 | 0.68 | 0.78 |
| 13 | 246 | 0.73 | 0.87 |
| 14 | 246 | 1.52 | 0.88 |
| 15 | 384 | 1.08 | 0.82 |
| 16 | 384 | 0.65 | 0.82 |
| 17 | 530 | 0.69 | 0.78 |
| 18 | 530 | 0.71 | 0.80 |

Numerous variations of the basic package structure and methods are possible. For example, the substrates for the spring chip and the pad chip may be glass, quartz, ceramic, flexible organic materials, metal or semiconductors, such as silicon, GaAs or InP. As mentioned before, the adhesive may be completely curable by the activator, rather than using any UV or visible light. Application of the activator and the adhesive may occur on either of the pad chip or the spring chip and application may include spraying, spinning or painting the activator onto whichever structure.

Figure 9:
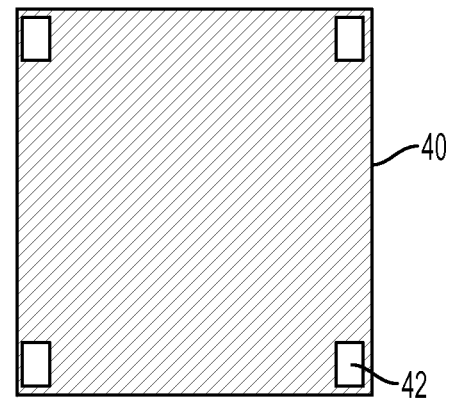
FIG. 9 shows a top view of a micro-spring interconnect package having spacers.
Figure 10:
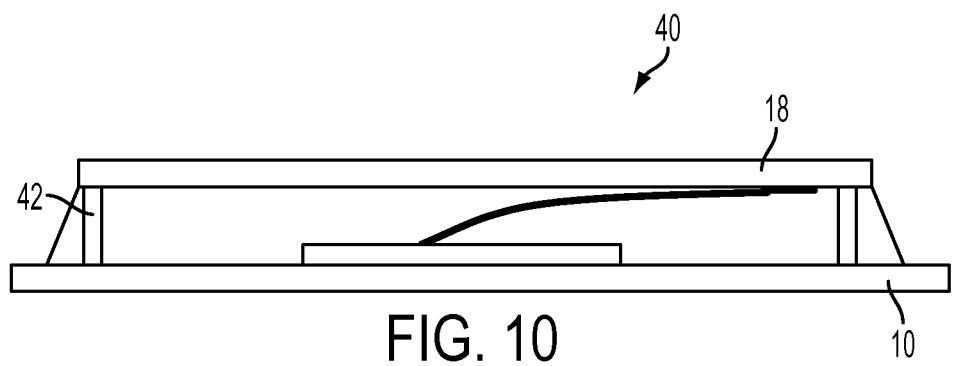
FIG. 10 shows a side view of an embodiment of a micro-spring interconnect package having spacers.

Another modification may include the use of spacers. The spacers would define the gap between the two chips. FIG. 9 shows a top down view of such a package 40. In the package, spacers such as 42 may be positioned at the corners of the package to define the gap between the two chips. The corners are merely an example and the spacers could be located in any region, including around the entire periphery of the package. In one example, the spacers may consist of polyimide. The spacers may be pillars or walls. FIG. 10 shows a side view of the package 40 having the spacers 42. The gap between the pad chip 10 and the spring chip 18 is defined by these spacers.

Figure 11:
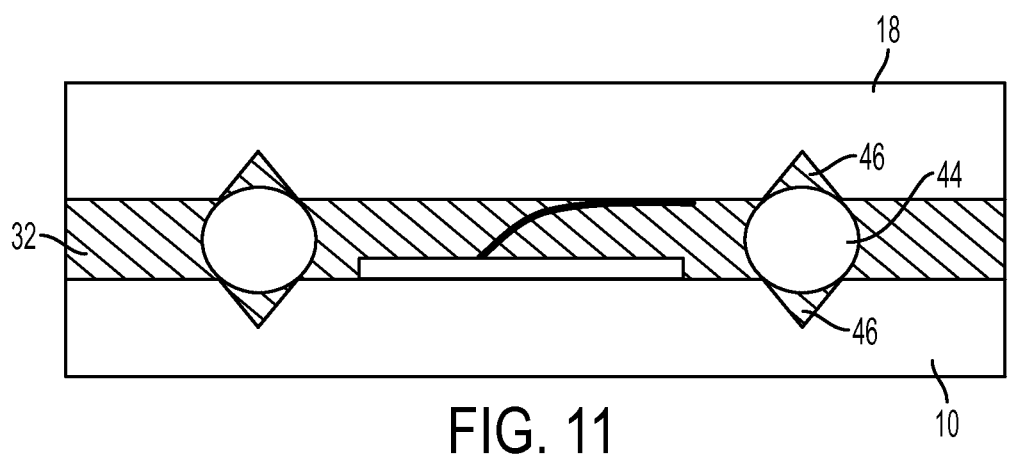
FIG. 11 shows a side view of an alternative embodiment of a micro-spring interconnect package having spacers.

In an alternative spacer arrangement, the spacers may consist of beads, as shown in FIG. 11. The spacer beads, such as 44, may reside in alignment pits such as 46. Alternatively, the spacer beads may be mixed with the adhesive 32, or another adhesive, to hold them in place during alignment and contact. Again, while the view of FIG. 11 shows them located at the periphery of the contact pads, these spacers could be located anywhere in the space between the two chips.

In this manner, an improved micro-spring package results from the use of activator-assisted molding adhesives into which are embedded the spring contacts. The activator promotes at least partial curing of the adhesive to make for a more robust package that can withstand thermal cycling. Optional spacer and alignment features can be incorporated.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method, comprising:
    providing a pad chip having contact pads;
    providing a spring chip having micro-springs;
    applying a chemical activator to one of either the pad chip or the spring chip;
    applying an adhesive responsive to the chemical activator on the other of the pad chip or the spring chip;
    aligning the pad chip to the spring chip such that the micro-springs will contact the contact pads; and
    pressing the pad chip and the spring chip together such that the chemical activator at least partially cures the adhesive.

2. The method of claim 1, wherein the chemical activator is applied to the pad chip and the adhesive is applied to the spring chip.

3. The method of claim 1, wherein applying the chemical activator comprises one of painting, spraying or spinning the chemical activator.

4. The method of claim 1, wherein the chemical activator completely cures the adhesive.

5. The method of claim 1, further comprising exposing the adhesive to UV light to completely cure the adhesive.

6. The method of claim 1, further comprising placing one of spacer pillars or spacer walls on one of either the pad chip or the spring chip.

7. The method of claim 1, further comprising etching alignment pits into at least one of the pad chip or the spring chip, and placing spacer beads into the alignment pits.

* * * * *